United States Patent
Kim et al.

(10) Patent No.: US 9,882,053 B2
(45) Date of Patent: Jan. 30, 2018

(54) MOLDED DIELECTRIC FIN-BASED NANOSTRUCTURE

(71) Applicant: Intel Corporation, Santa Clara, CA (US)

(72) Inventors: Seiyon Kim, Portland, OR (US); Kelin J. Kuhn, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/138,254

(22) Filed: Dec. 23, 2013

(65) Prior Publication Data

US 2015/0179786 A1 Jun. 25, 2015

(51) Int. Cl.
- *H01L 29/78* (2006.01)
- *H01L 29/66* (2006.01)
- *H01L 21/56* (2006.01)

(52) U.S. Cl.
CPC .......... *H01L 29/785* (2013.01); *H01L 21/565* (2013.01); *H01L 29/66795* (2013.01)

(58) Field of Classification Search
CPC .................. H01L 29/66795; H01L 21/565
See application file for complete search history.

(56) References Cited

U.S. PATENT DOCUMENTS

| | | | |
|---|---|---|---|
| 7,494,862 B2 | 2/2009 | Doyle | |
| 8,440,517 B2* | 5/2013 | Lin et al. | 438/197 |
| 2008/0145997 A1* | 6/2008 | Tu | 438/398 |
| 2010/0258870 A1 | 10/2010 | Hsu et al. | |
| 2011/0140229 A1 | 6/2011 | Rachmady | |
| 2011/0198696 A1 | 8/2011 | Choi et al. | |
| 2011/0291166 A1 | 12/2011 | Booth | |
| 2011/0316080 A1 | 12/2011 | Luo | |
| 2012/0171832 A1 | 7/2012 | Toh | |
| 2012/0286346 A1 | 11/2012 | Nakazawa | |
| 2013/0217204 A1 | 8/2013 | Park | |
| 2013/0244387 A1* | 9/2013 | Cho | H01L 21/76224 438/283 |
| 2013/0249019 A1* | 9/2013 | Kelly et al. | 257/402 |
| 2013/0270638 A1* | 10/2013 | Adam | H01L 29/66795 257/347 |
| 2015/0056781 A1* | 2/2015 | Akarvardar et al. | 438/413 |

OTHER PUBLICATIONS

Wolfram Mathworld, "Collinear," http://mathworld.wolfram.com/Collinear.html, 2 Pages.

(Continued)

*Primary Examiner* — Lex Malsawma
*Assistant Examiner* — Xia Cross
(74) *Attorney, Agent, or Firm* — Trop, Pruner & Hu, P.C.

(57) ABSTRACT

An embodiment concerns selective etching of a structure (e.g., a fin) to form a void with the shape of the original structure. This void then functions as a mold. Flowable dielectric material fills the void to form the same shape as the original structure/mold. Post-processing then occurs (e.g., oxidation build up and annealing) to harden the dielectric in the void. The resulting product is a molded dielectric nanostructure that has the same shape as the original structure but consists of a different material (e.g., dielectric instead of silicon). Other embodiments are described herein.

20 Claims, 8 Drawing Sheets

(56) References Cited

OTHER PUBLICATIONS

International Searching Authority, "Notification of Transmittal of the International Search Report and the Written Opinion of the International Searching Authority," dated Jun. 12, 2015, in International application No. PCT/IB2015/000218.
Taiwan Intellectual Property Office, Office Action dated Apr. 14, 2016 in Taiwanese Patent Application No. 103140071.
European Patent Office, Extended European Search Report dated Jun. 21, 2017 in European Patent Application No. 15731235.6.

* cited by examiner

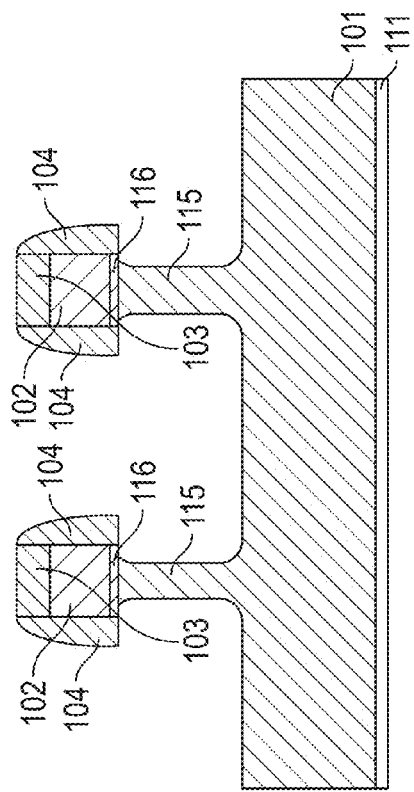
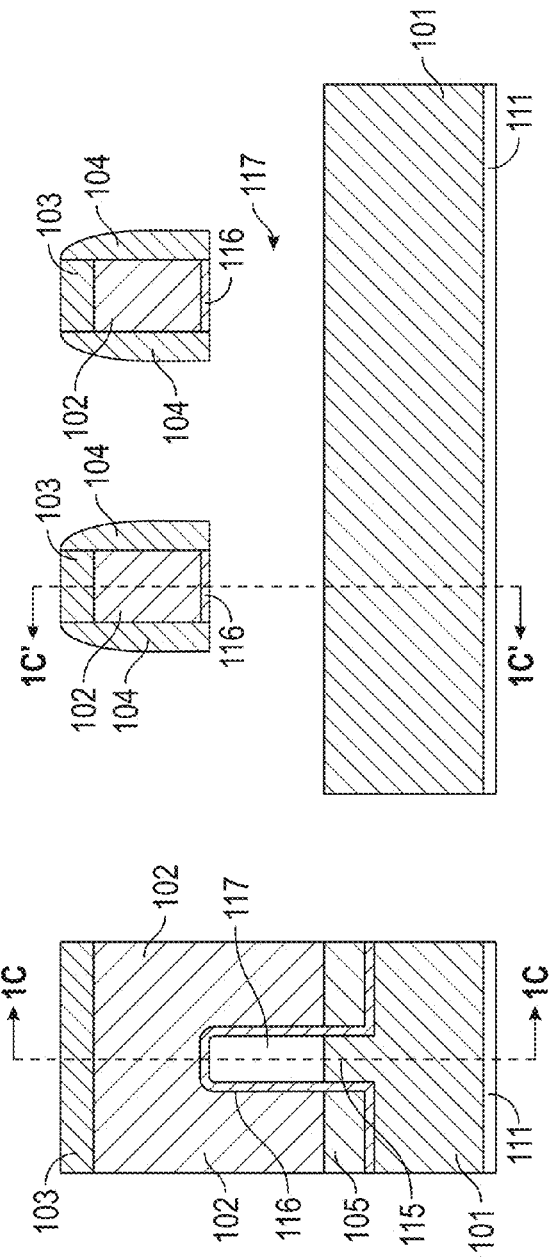

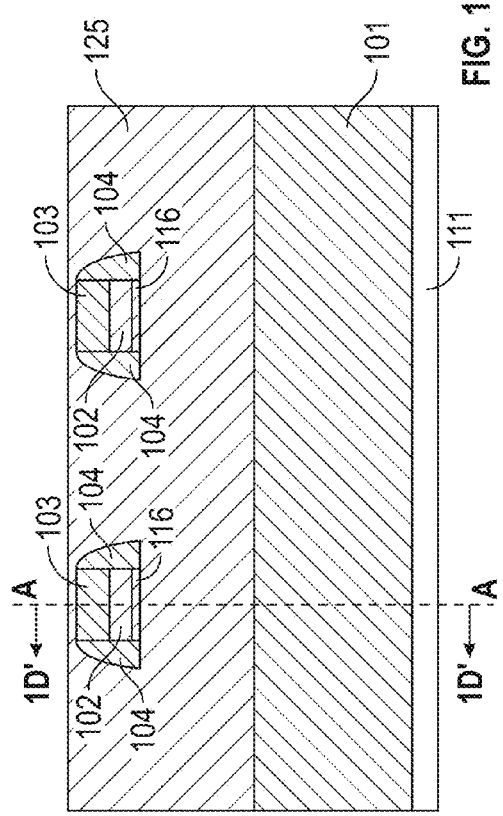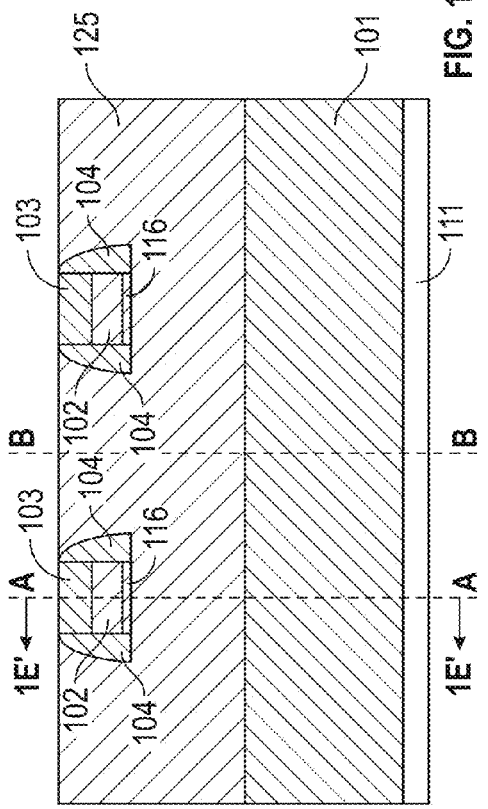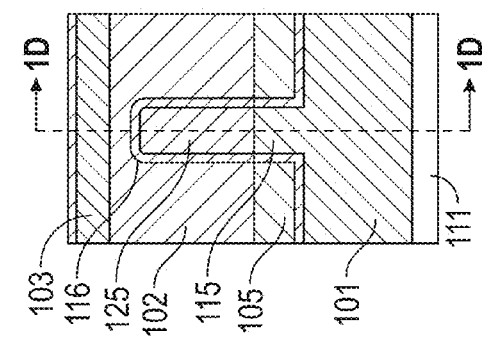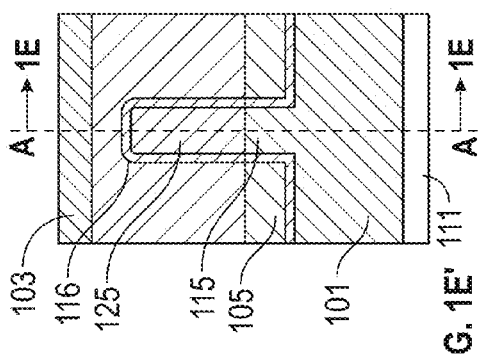

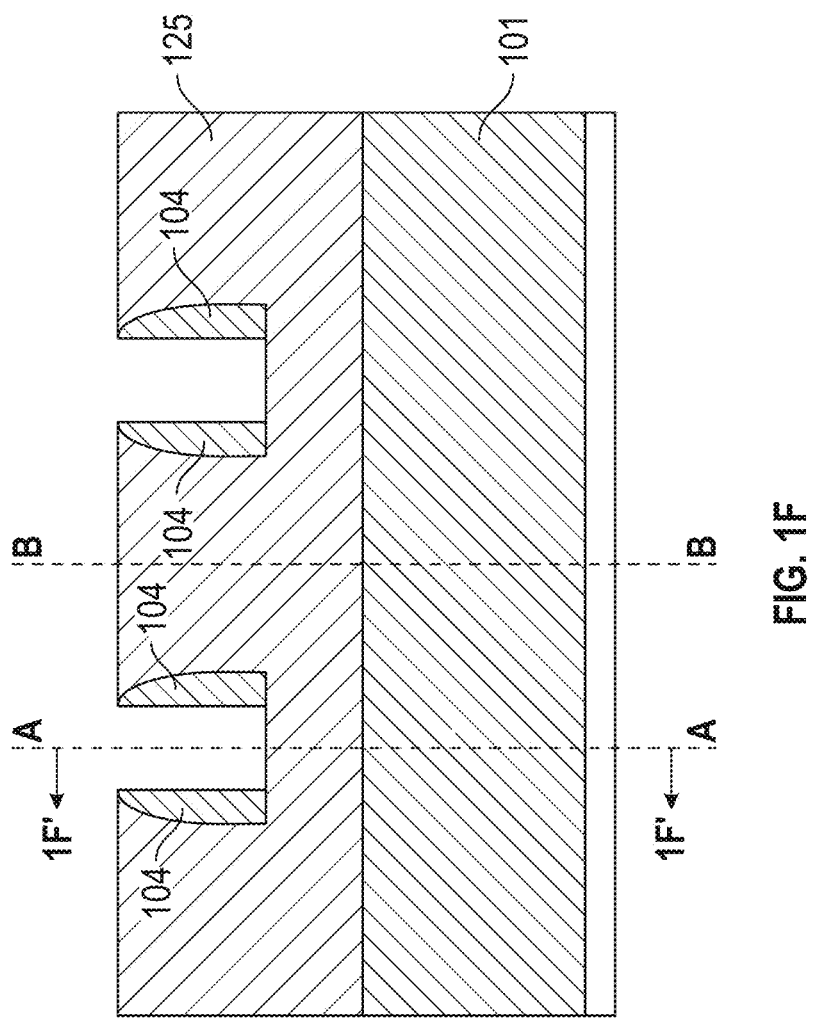
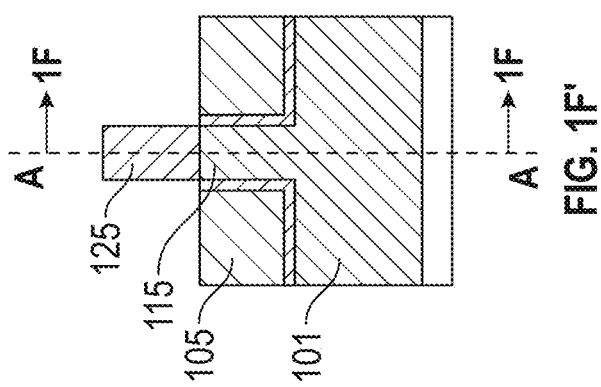

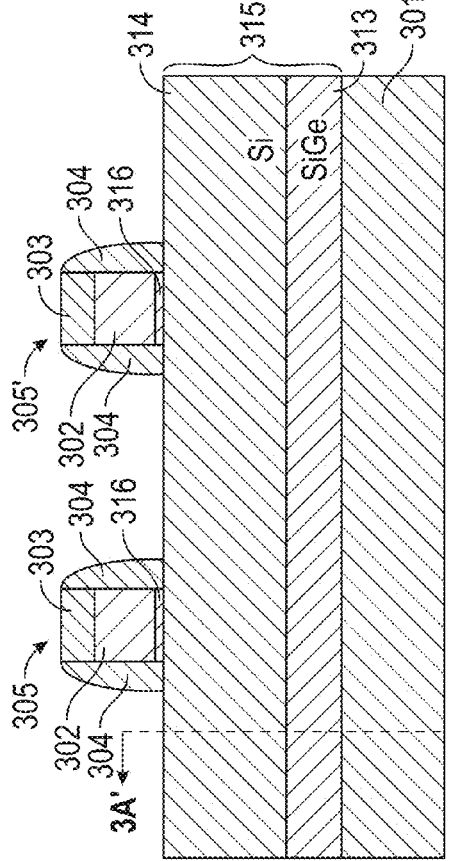
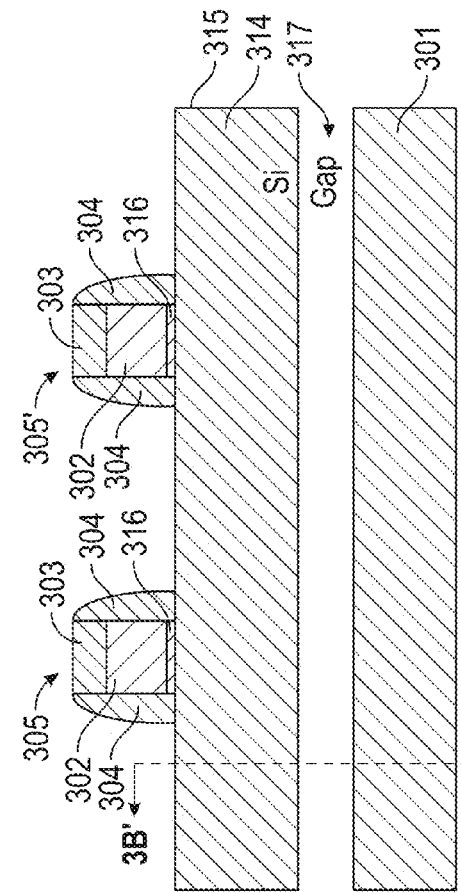
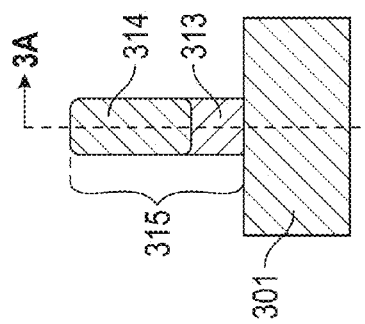
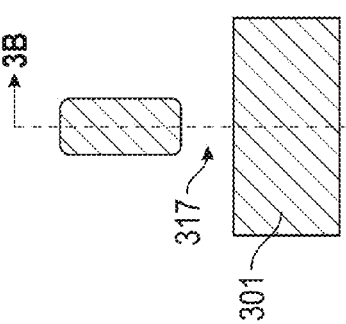

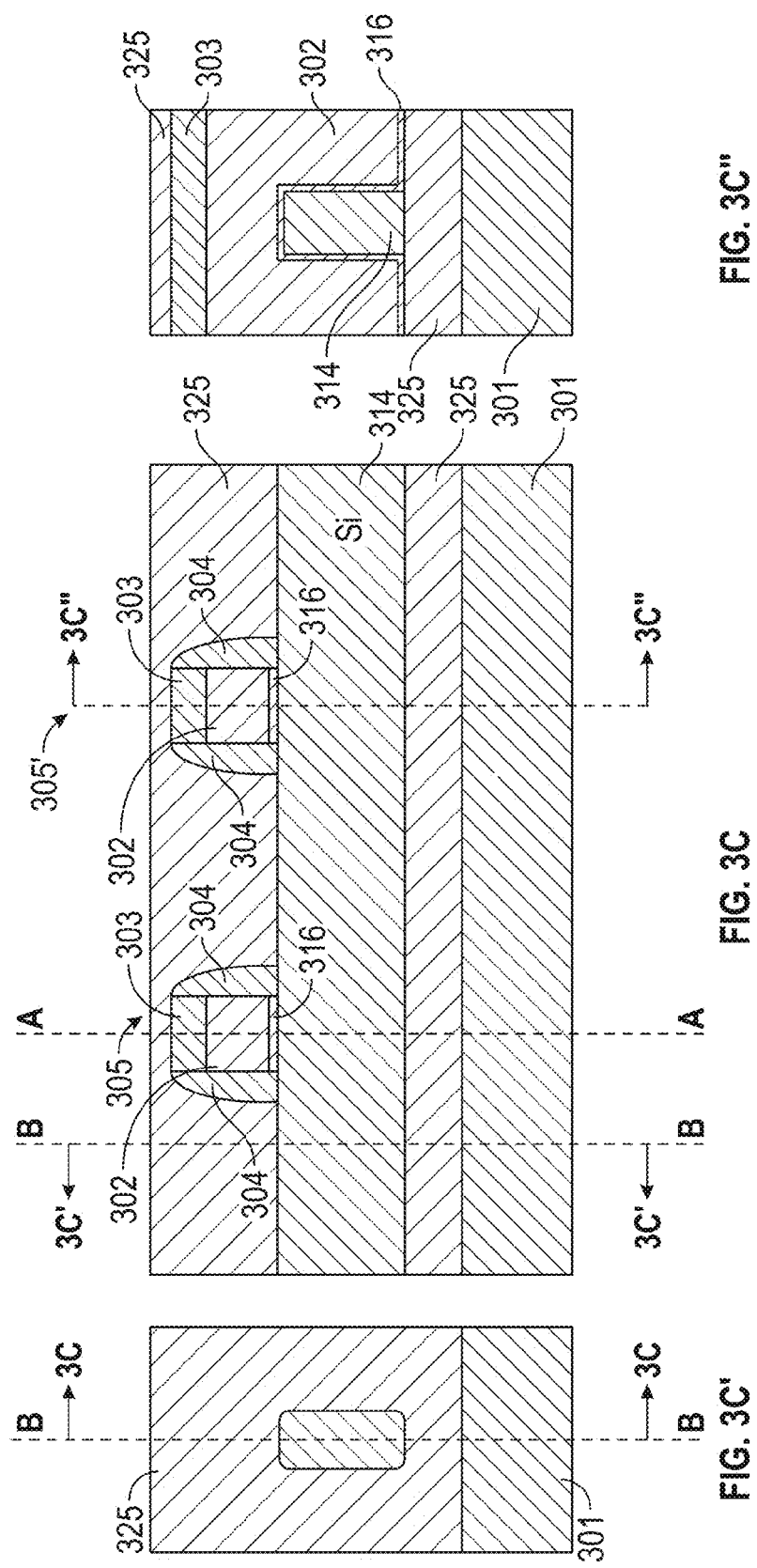

MOLDED DIELECTRIC FIN-BASED NANOSTRUCTURE

BACKGROUND

Shallow trench isolation (STI) is a common semiconductor process employed to isolate two neighboring portions of a substrate or structure formed thereon. STI can be carried out, for example, early on in the fabrication of a semiconductor device prior to the formation of transistors or other components, such as on a blank substrate. STI can also be carried out at some later time in the fabrication process when at least some portion of a semiconductor structure is formed.

STI generally includes etching one or more trenches in the substrate (such as a blank substrate, or a partially completed semiconductor structure such as quantum well growth structure), and then depositing dielectric materials (such as silicon dioxide) to fill the trenches. The excess dielectric material can then be removed using chemical-mechanical planarization (CMP).

STI may be employed to isolate two neighboring portions of a substrate or structure formed thereon. Those neighboring portions may include transistors or other circuit components.

One such transistor includes a conventional metal oxide semiconductor field effect transistor (MOSFET), where the source, channel, and drain structures are constructed adjacent to each other within the same plane. The gate dielectric is formed on the channel area and the gate electrode is deposited on the gate dielectric. The transistor is controlled by applying a voltage to the gate electrode thereby allowing a current to flow through the channel between source and drain. The area necessary to support these structures in a plane constrains the number of transistors that can be placed within the limited area of a semiconductor chip. Semiconductor manufacturers increase the packing density of transistors by scaling down the size of the transistor at each generation of technology.

A tri-gate transistor, or non-planar transistor, allows for greater packing density of transistors. A tri-gate transistor includes a thin semiconductor body (e.g., a silicon fin) formed on a substrate and having a top surface and two sidewall surfaces perpendicular (or almost perpendicular) to the top surface. A gate structure is formed on the substrate and the silicon fin perpendicular to the silicon fin. Source and drain regions are formed in the fin on opposite sides of the gate structure. Because the gate structure surrounds the silicon fin on the three surfaces, the transistor essentially has three separate gates. These three separate gates provide three separate channels for electrical signals to travel, thus effectively tripling the conductivity as compared to a conventional planar transistor.

BRIEF DESCRIPTION OF THE DRAWINGS

Features and advantages of embodiments of the present invention will become apparent from the appended claims, the following detailed description of one or more example embodiments, and the corresponding figures, in which:

FIGS. 1a-f depict a process for full isolation in an embodiment of the invention.

FIGS. 3a-c depict a process for bottom isolation in an embodiment of the invention.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As mentioned above, STI uses dielectrics to provide isolation between structures, such as transistors. Transistors come in varied forms, such as non-planar transistors. An embodiment provides a novel manner for providing isolation within the structures themselves, such as within fins that are used for non-planar transistors, metal-insulator-metal (MIM) capacitors, MIM capacitors formed on fins, and the like.

Figure 1A:
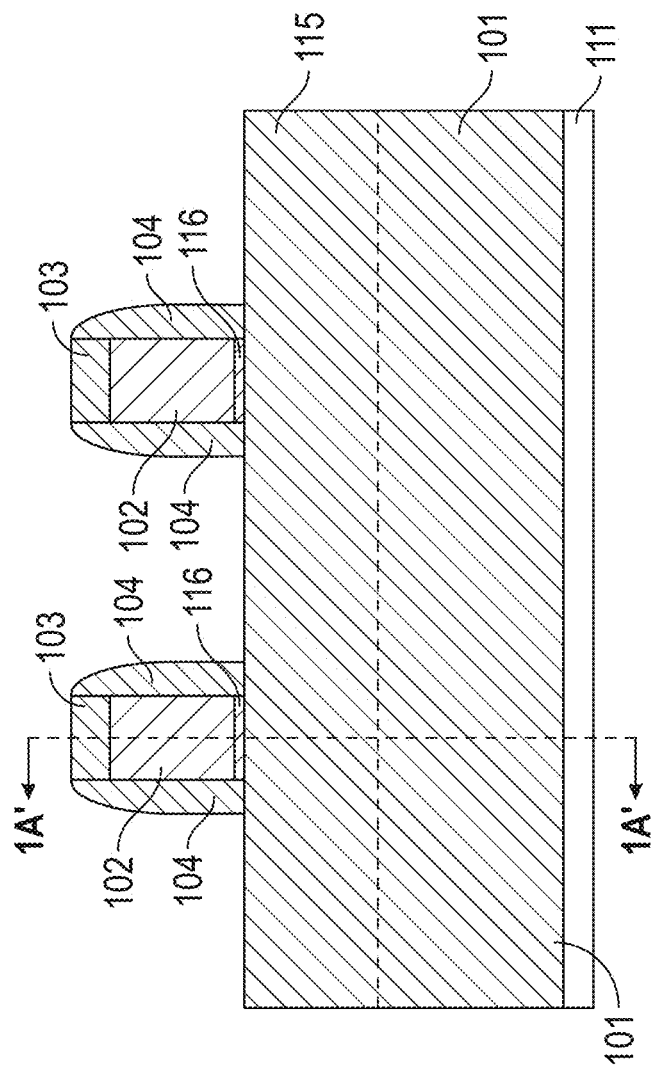

FIG. 1a depicts polysilicon and spacer formation on a fin in an embodiment. FIG. 1a' illustrates a cross-sectional view of a tri-gate structure, which forms a portion of a circuit substrate. The structure includes a gate structure formed on substrate 111 and on a portion of body or fin 115. Substrate 111 can be bulk silicon or silicon-on-insulator (SOI). Fin 115 is in a different plane relative to substrate 111 and is situated perpendicular relative to the gate structure. FIG. 1a includes a side view of fin 115 and includes two gate structures. FIG. 1a is simplified and in reality there may be 1 such gate device or many more (e.g., 3, 4, 8) located along fin 115.

In one embodiment, substrate 111 can be composed of a single crystal semiconductor material, which can be, for example, silicon or germanium. Fin 115 may be composed of a semiconductor material such as silicon, germanium, SiGe, a III-V composition, combinations thereof, and the like. In some embodiments fin 115 includes buried section 101, which lies below the surface of the plane of the structure and is buried under oxide layer 105 and fin 115. In the embodiment fin 115, including buried section 101, may be formed by patterning and etching substrate 111 to define fin 115 as a portion (a non-planar portion) of the substrate and depositing dielectric material (e.g., oxide layer 105), on a surface of substrate 111 adjacent to fin 115 to define buried section 101. In some embodiments portions 101 and 111 are monolithic with one another. In other embodiments they may not be monolithic with each other and may include different materials, dopants, and the like.

The gate structure mentioned above includes layers or portions 102, 103, 104, 116. Layer 116 can be a dielectric material, such as silicon dioxide ($SiO_2$), silicon nitride ($Si_3N_4$), oxynitride ($SiO_yN_x$) and the like. In some embodiments, layer 116 can be a high dielectric constant (high-k) dielectric material, such as hafnium oxide ($HfO_2$). Alternately, layer 116 can be a dielectric film with a metal at the top surface. Layer 102 can be a polycrystalline semiconductor material, such as polycrystalline silicon (polysilicon) or polysilicon germanium (poly-SiGe) or a metal material, such as titanium nitride. Layer 103, sometimes referred to as a "hard mask," can be a non-conductive material, such as silicon dioxide, silicon nitride and the like. Portion 104 may include oxide spacers used in forming layers 102, 103, and/or 116.

Figure 1A:
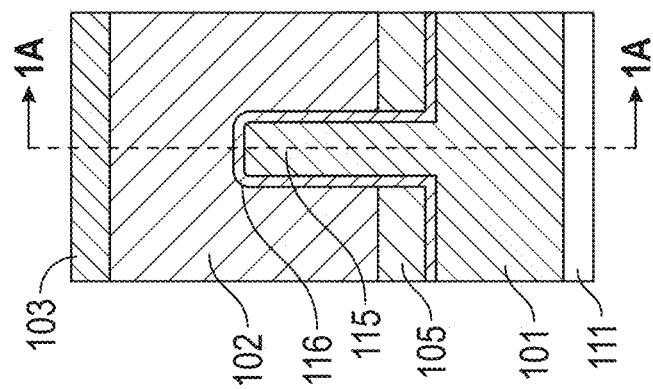

The embodiment of FIG. 1 provides a form from which selective etching can be performed to build nano-scale dielectric structures embedded in ultra scaled devices (e.g., CMOS devices), such as devices scaled at 45, 32, 22, 14, 10 nm scales and like. More specifically, an embodiment concerns selective etching of a structure (e.g., fin), such as a buried structure, to form a void with the shape of the original structure. This void then functions as a mold. Flowable dielectric material fills the void to form the same shape as the original structure/mold. Post-processing may then occur (e.g., oxidation build up and annealing under various conditions including environments containing $O_2$, $N_2$, $H_2$, He, or various plasma treatments) to harden or covert or generally process the dielectric in the void. The resulting product has the same or nearly the same shape as the original structure but consists of different material than the original structure (e.g., dielectric instead of silicon).

There are many applications for such a method and corresponding apparatus. Embodiments of the method can provide a way to form an isolation layer in CMOS devices (i.e., the formed dielectric provides isolation). For example, in a series of three gate structures (one more than is shown in FIG. 1a) the middle gate structure may be converted to a dielectric isolation layer or device providing some isolation between the other two gate devices, which may become fully functioning tri-gate transistors. In other embodiments the molded dielectric can be utilized to fabricate dielectric nanostructures which can be used for passive components such as capacitors and inductors (both of which require dielectric isolation in some embodiments). For example, the molded dielectric may be molded between two capacitive plates of a capacitor (e.g., a MIM capacitor) or within a coiled interconnect or line structure of an inductor. Other embodiments may be used in microelectromechanical systems (MEMS) components, such as a dielectric plate in a MEMS capacitor or a dielectric/electrode module in a radiofrequency (RF) MEMS switch.

FIGS. 1b and 1c begin the transformation of the apparatus of FIG. 1a into a nano-scale dielectric structure. FIGS. 1b and 1c depict selective undercut etching partially completed (FIG. 1b) and fully completed (FIG. 1c). The etch may be selective to the materials of fin 115 (i.e., selective etching processes are those in which one material is etched rapidly while the other is etched very slowly or not etched at all) and/or may be a timed etch as well. The selective etch removes some or all of fin 115 leaving void 117 as a result. As depicted in FIG. 1c', a portion of the original fin 115 remains with a void 117 where another portion of the fin used to be.

FIG. 1d shows the mold having been filled with flowable oxide 125, such as SiON, although silicon oxide, silicon nitride, silicon carbide, and the like are also possible flowable dielectrics in other embodiments. FIG. 1e shows the apparatus after excess oxide 125 is removed by polishing (e.g., CMP). FIG. 1f shows the apparatus after selective etching of layers 116, 102, 103 using etch specific chemistries corresponding to the materials of layers 116, 102, 103 using selective etch chemistries known to those of skill in the art.

At this point, as seen in FIG. 1f, dielectric 125 is directly above the remainder of fin 115 (and/or the hidden portion 101). There was selective etching of some or all of a buried structure (e.g., fin 115) to form a void 117 that was filled fully or partially with dielectric 125 to form a nano-scale dielectric structure embedded in or adjacent ultra scaled devices, such as CMOS devices. Those devices, while not shown in FIG. 1f, may include gate structures that were not etched away with the shape of the original fin structure. A source and drain may be located on either side of a still present gate structure to form a non-planar transistor. These gate structures, protected with masking and like from aforementioned etching, may serve as fully functioning non-planar transistors.

In an embodiment one or more of the gate structures of, for example, FIG. 1e may be retained. In such a case portion 125 may be smaller and portion 115 may be larger than that shown in FIG. 1e'. In other words, the etch of 115 may have been less severe. There may be a portion 115 that extends up into the area surrounded by the gate structure layers 116 and 102. There may still be a dielectric 125 above this portion. A source and drain may be located on either side of the gate to form a non-planar transistor.

Figure 2A:
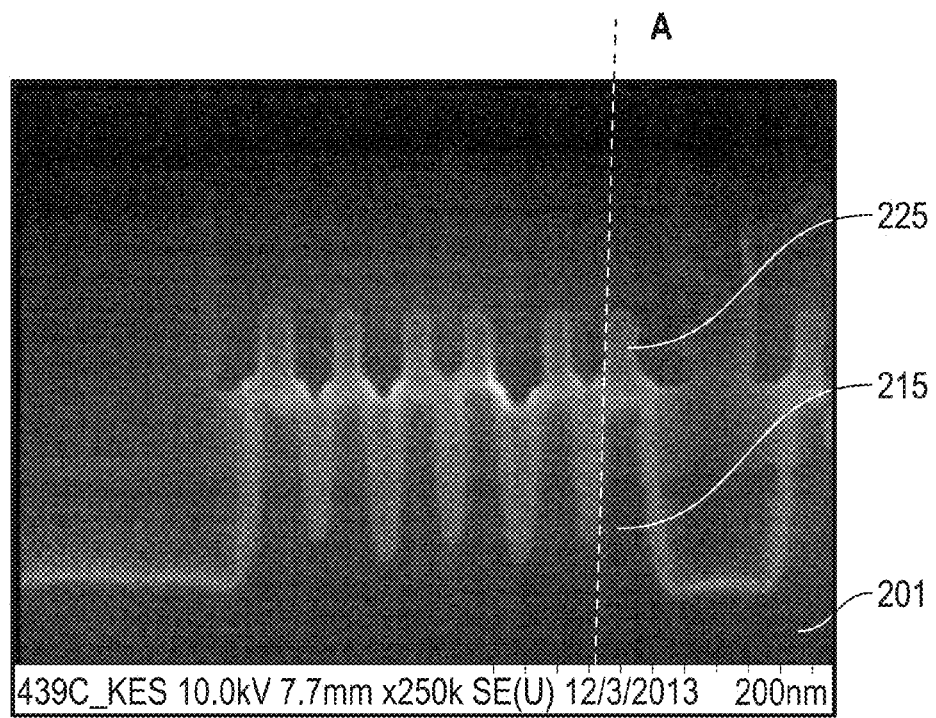
FIGS. 2a-b include images of fully isolated nanostructures in an embodiment of the invention.

FIG. 2a includes a scanning electron microscope (SEM) image of a fin structure taken from a perspective analogous to FIG. 1f. The structure includes a fin portion 225, which includes SiON, based or formed on a fin portion 215, which includes silicon, all over substrate 201. Axis A shows how the sidewalls of portions 225, 215 are collinear illustrating how portion 225 was molded into the form previously made by upper portions of the original fin.

Figure 2B:
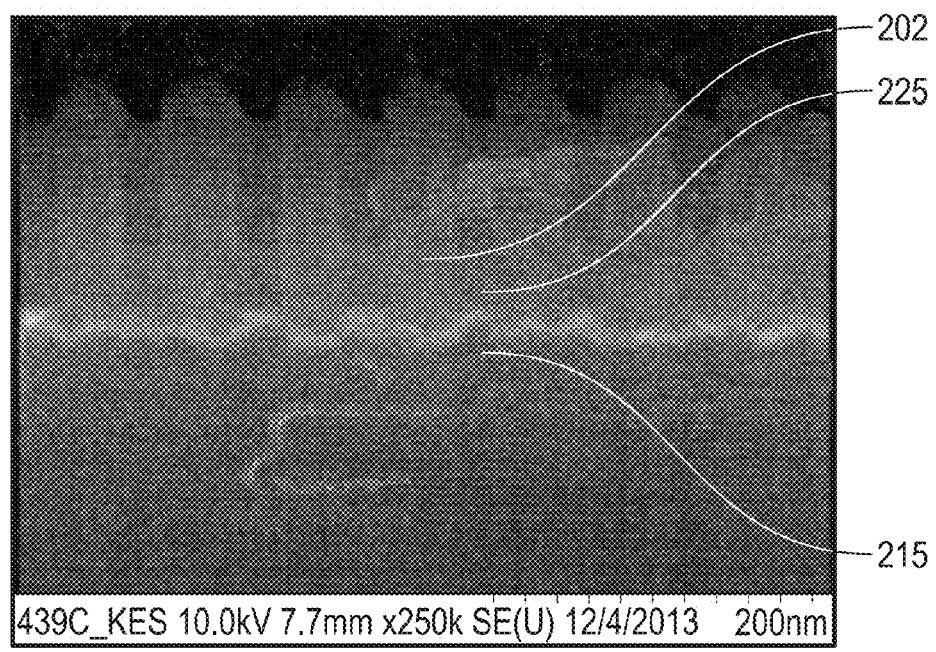

FIG. 2b includes a SEM image of a fin structure taken from a perspective analogous to FIG. 1f. The structure includes a fin portion 225, which includes SiON, based on a fin portion 215, which includes silicon. Layer 202 includes polysilicon of a gate structure.

FIG. 3a depicts polysilicon and spacer formation in an embodiment. FIG. 3a' illustrates a cross-sectional view of a tri-gate structure which forms a portion of a circuit substrate. The structure includes a gate structure formed on substrate 301 and on a portion of fin 315. Substrate 301 can be bulk silicon or SOI. Fin 315 is in a different plane relative to substrate 301 and is situated perpendicular relative to the gate structure. FIG. 3a includes a side view of fin 315 and includes two gate structures. FIG. 3a is simplified and in reality there may be 1 such gate device or many more (e.g., 3, 4, 8) located along fin 315.

In one embodiment, substrate 301 can be composed of a single crystal semiconductor material, which can be, for example, silicon or germanium and the like. Fin 315 may be composed of a semiconductor material such as silicon 314 on SiGe 313, and the like. In an embodiment fin 315 may be formed by patterning and etching substrate 301 to define fin 315 as a portion (a non-planar portion) of the substrate. Layer 314 may be grown epitaxially on layer 313 in some embodiments or may be formed via layer transfer and the like in other embodiments.

The gate structure of FIG. 3a can include layers or portions 302, 303, 304, 316. Layer 316 can be a dielectric material, such as $SiO_2$, $Si_3N_4$, $SiO_yN_x$ and the like. In some embodiments, layer 316 can be a high-k dielectric material, such as $HfO_2$. Alternately, layer 316 can be a dielectric film with a metal at the top surface. Layer 302 can be a polycrystalline semiconductor material, such as polysilicon or poly-SiGe or a metal material, such as titanium nitride. Layer 303, sometimes referred to as a "hard mask," can be a non-conductive material, such as silicon dioxide, silicon nitride and the like. Portion 304 may include oxide spacers used in forming layers 302, 303, and/or 316.

The embodiment of FIG. 3a provides a form from which selective etching can be performed to build nano-scale dielectric structures embedded in ultra scaled CMOS devices.

FIG. 3b begins the transformation of the apparatus of FIG. 3a into a nano-scale dielectric structure. FIG. 3b depicts selective undercut etching of SiGe 313 to form void 317. The selective etch removes some or all of the SiGe 313 portion of fin 315 leaving void 317 as a result. Void 317 will serve as a mold as seen below.

FIG. 3c shows the void/mold 317 having been filled with flowable oxide 325, such as SiON. While not shown, excess oxide 325 may be removed by polishing (e.g., CMP). Here, unlike FIG. 1f, the gate structure is maintained and there is no selective etching of layers 316, 302, 303. Thus, at this point dielectric 325 is directly above the remainder of fin portion 114. There was selective etching of a buried structure (e.g., fin portion 313) to form a void 317 that was filed with dielectric 325 to form a nano-scale dielectric structure embedded in or adjacent ultra scaled CMOS devices with the shape of the original fin structure. CMOS transistor devices 305, 305' may each benefit from isolation dielectric 325 above portion 303 and isolation dielectric 325 below fin portion 314. This may promote less leakage current and/or resistive-capacitive (RC) delay performance and more efficient device operation overall. A source and drain may be formed on either side of gate structures 305, 305' to form non-planar transistors capable of full switching function.

Embodiments described herein provide a nano-scale dielectric structure for highly scaled logic devices that utilize forms, such as fins, that can be etched to form molds that can be filled fully or partially with dielectric. This provides, for example, novel isolation for logic devices and may also enable novel passive components as described above.

Figure 4:
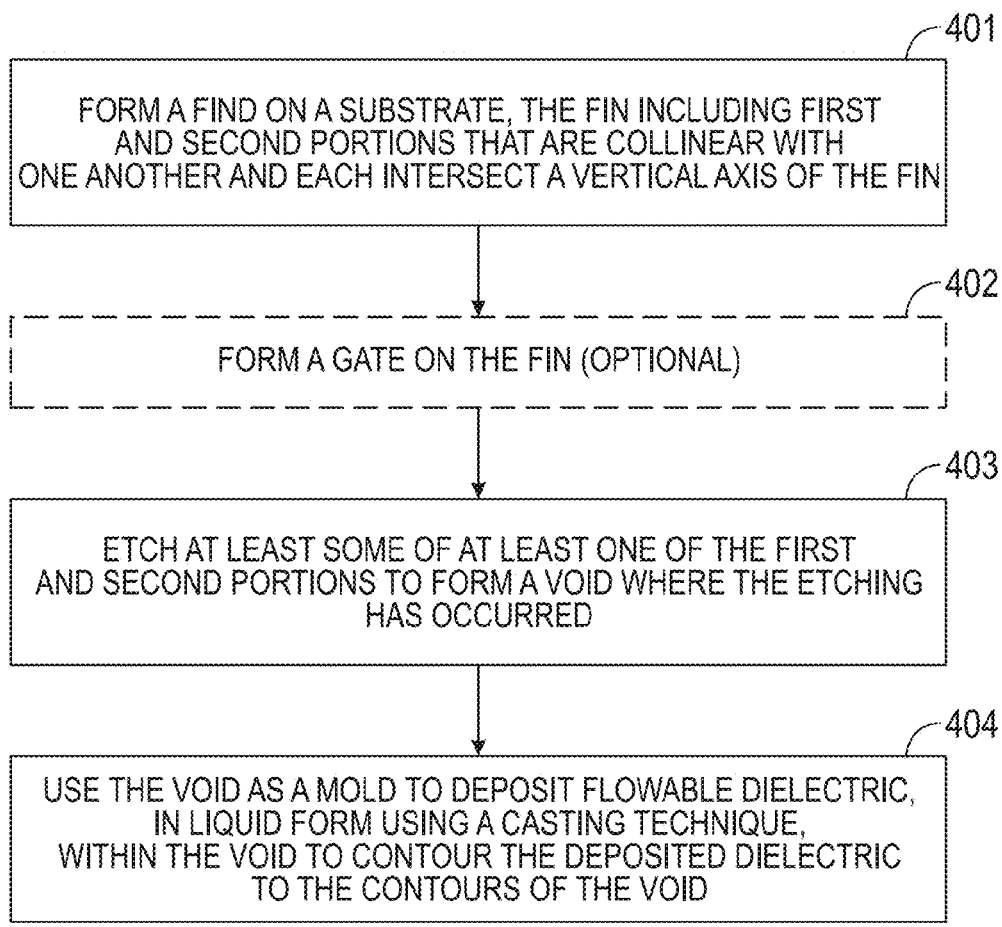
FIG. 4 includes a method in an embodiment of the invention.

FIG. 4 includes a method in an embodiment. Block 401 includes forming a fin on a substrate, the fin including first and second portions that are collinear with one another and each intersect a vertical axis of the fin. Block 403 includes etching at least some of at least one of the first and second portions to form a void where the etching has occurred. Block 404 includes using the void as a mold to deposit flowable dielectric, in liquid form using a casting technique, within the void to contour the deposited dielectric to the contours of the void. This may yield, in some embodiments, a dielectric having been molded to include the same contour and dimensions as the original fin portion that was etched away. In an embodiment the sidewalls of the dielectric and remaining fin are collinear. Block 402 can optionally include forming a gate on the fin.

The following examples pertain to further embodiments.

Example 1 includes an apparatus comprising: a fin including first and second portions that are collinear with one another and each intersect a vertical axis of the fin; wherein (a) the first portion includes a flowable dielectric; (b) the second portion includes a semiconductor material but no dielectric. For instance, in FIG. 1f axis A intersects portions 125 and 115.

In example 2 the subject matter of the Example 1 can optionally include wherein the flowable dielectric is selected from the group comprising silicon oxide, silicon dioxide, silicon nitride, oxynitride ($SiO_yN_x$), and silicon carbide.

In example 3 the subject matter of the Examples 1-2 can optionally include the first portion includes a first sidewall that is collinear with a second sidewall of the second portion. For instance, in FIG. 2a axis A is arranged along sidewalls of portions 225 and 215.

In example 4 the subject matter of the Examples 1-3 can optionally include wherein the semiconductor material is selected from the group comprising silicon, germanium, SiGe, a group III element, and a group V element.

In example 5 the subject matter of the Examples 1-4 can optionally include wherein the first portion includes a void immediately adjacent the flowable dielectric. Flowable oxide may fill the void completely or partially. A partial fill may create a void. Also, voids may exist if, for instance, the dielectric is deposited using chemical vapor deposition (CVD), atomic layer deposition (ALD), and the like.

In example 6 the subject matter of the Examples 1-5 can optionally include wherein the first portion is directly above and in direct contact with the second portion.

In example 7 the subject matter of the Examples 1-6 can optionally include a gate directly over the first portion and intersecting the vertical axis. For instance, axis A in FIG. 1e' intersects fin portions 125 and 115 as well as gate portion 102. For instance, axis A in FIG. 3c intersects fin portion 325 and as well as gate portion 302. Axis A also intersects a portion of 301 below fin portion 325 and that portion of 301 may be part of the fin.

In example 8 the subject matter of the Examples 1-7 can optionally include wherein the fin includes a third portion (a) that is not collinear with the first and second portions, (b) does not intersect the vertical axis of the fin, (c) includes flowable dielectric; (d) intersects an additional vertical axis of the fin that does not intersect the gate. For instance, in FIG. 1e axis A intersects portions 125 and 115 while axis B still intersects the fin and the dielectric but not the exact same locations as axis A.

In example 9 the subject matter of the Examples 1-8 can optionally include wherein the fin includes a third portion (a) that is collinear with the first and second portions, (b) intersects the vertical axis of the fin, (c) includes at least one of the semiconductor material and another semiconductor material; and (d) is directly over the first portion. For instance, in FIG. 3c' axis A intersects portions 301, 314 below and above portion 325. A portion of portion 301 may be included in the fin.

In example 10 the subject matter of the Examples 1-9 can optionally include wherein the first portion is directly below and in direct contact with the second portion.

In example 11 the subject matter of the Examples 1-10 can optionally include wherein the second portion is surrounded by the flowable dielectric. For instance, in FIG. 3c' axis B intersects a silicon portion as well as dielectric portions above and below the silicon portion and generally surrounding the silicon portion.

In example 12 the subject matter of the Examples 1-11 can optionally include a third portion included in the fin; and a gate directly over the third portion and intersecting an additional vertical axis; wherein the third portion (a) is not collinear with the first and second portions, (b) does not intersect the vertical axis of the fin, (c) includes at least one of the semiconductor material and another material; (d) intersects the additional vertical axis; and (e) is not surrounded by the flowable dielectric. For instance, in FIG. 3c axis A intersects a gate portion. The another material may include polysilicon, a metal, and the like.

In example 13 the subject matter of the Examples 1-12 can optionally include wherein the flowable dielectric is included in a capacitor. For instance, in FIG. 3c isolation 325 may form an insulator in a metal-insulator-metal (MIM) capacitor, whereas portions 301 and/or 314 may act as capacitive plate(s) or couple to capacitive plates for the MIM capacitor. In an embodiment portion 314 and/or 301 or portions thereof may be selectively etched and filled with metal (in a manner similar to the dielectric fill methods described herein) to form the MIM capacitor having insulator 325.

In example 14 the subject matter of the Examples 1-13 can optionally include wherein the flowable dielectric is adjacent at least one capacitive plate.

Example 15 includes a method comprising: forming a fin on a substrate, the fin including first and second portions that are collinear with one another and each intersect a vertical axis of the fin; etching at least some of at least one of the first and second portions to form a void where the etching has occurred; using the void as a mold to deposit flowable dielectric within the void to contour the deposited dielectric to the contours of the void; wherein the first portion includes a first sidewall that is collinear with a second sidewall of the second portion.

In example 16 the subject matter of the Example 15 can optionally include forming a gate on the fin; wherein etching at least some of at least one of the first and second portions to form a void includes undercut etching the first portion while the first portion is directly below the gate.

In example 17 the subject matter of the Examples 15-16 can optionally include wherein the flowable dielectric is selected from the group comprising silicon oxide, silicon dioxide, silicon nitride, oxynitride (SiOyNx), and silicon carbide and the method further comprises depositing the flowable dielectric in liquid form using a casting process.

In a casting process the material to be deposited is dissolved in liquid form in a solvent. The material can be applied to the substrate by spraying or spinning. Once the solvent is evaporated, a thin film of the material remains on the substrate. The thicknesses that can be cast on a substrate range all the way from a single monolayer of molecules (adhesion promotion) to tens of micrometers.

In example 18 the subject matter of the Examples 15-17 can optionally include wherein etching at least some of at least one of the first and second portions to form a void includes selectively etching the first portion with an etch chemistry configured to selectively etch at least one of silicon, germanium, a group III element, and a group V element.

Example 19 includes an apparatus comprising: a fin including first, second, and third portions that are collinear with one another and each intersect a vertical axis of the fin; wherein (a) the first portion includes a flowable dielectric and is between the second and third portions; (b) the second and third portions each include a semiconductor material but no dielectric; (c) the second and third portions each couple to an interconnect; and (d) the first, second, and third portions are included in a metal-insulator-metal (MIM) capacitor. The second and third portions may or may not include the same semiconductor material.

In example 20 the subject matter of the Example 19 can optionally include wherein the flowable dielectric is selected from the group comprising silicon oxide, silicon dioxide, silicon nitride, oxynitride (SiOyNx), and silicon carbide.

Regarding the figures, please note the figures are not to scale and are merely attempts to illustrate aspects of embodiments. For example, element 102 appears to shorten between FIGS. 1c and 1d but this is merely in the figures and not necessarily in the actual embodiments. Further, two portions having the same hashing does not necessarily mean the two portions share the same materials. Two portions having unequal hashing does not necessarily mean the two portions do not share the same materials.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
    a substrate;
    a fin on the substrate and including first and second portions that each intersect a vertical axis of the fin; and
    a gate directly over the first portion and intersecting the vertical axis;
    wherein (a) the first portion includes a flowable dielectric and a first sidewall defined by a first plane that is not parallel to the substrate; (b) the second portion includes a semiconductor material, but no dielectric, and a second sidewall defined by a second plane that is generally coplanar with the first plane; (c) the flowable dielectric is selected from the group comprising silicon oxide, silicon dioxide, silicon nitride, oxynitride (SiO$_y$N$_x$), and silicon carbide; (d) a subportion of the second portion is completely surrounded, within a vertical plane that is parallel to the vertical axis, by the flowable dielectric, and (e) the subportion of the second portion is not located directly beneath the gate and does not intersect the vertical axis.

2. The apparatus of claim 1, wherein the first portion is directly above and in direct contact with the second portion.

3. The apparatus of claim 1 comprising a third portion that includes at least one of the semiconductor material and another semiconductor material and is included in an upper portion of the substrate;

wherein the first portion is between the second and third portions.

4. The apparatus of claim 3, wherein the flowable dielectric is included in a capacitor and the first and third portions each operatively couple to interconnects to form an operable metal-insulator-metal (MIM) capacitor.

5. The apparatus of claim 4, wherein the flowable dielectric is adjacent at least one capacitive plate.

6. The apparatus of claim 1, wherein the first portion is directly below and in direct contact with the second portion.

7. The apparatus of claim 1, wherein a horizontal axis intersects the gate and the flowable dielectric.

8. The apparatus of claim 1, wherein:
the subportion of the second portion directly contacts the flowable dielectric on four sides of the subportion of the second portion;
the four sides are all included in the vertical plane;
a first pair of the four sides oppose one another; and
a second pair of the four sides oppose one another.

9. An apparatus comprising:
a fin including first and second portions that each intersect a vertical axis of the fin;
a third portion that intersects the vertical axis and is included in an upper portion of a substrate; and
a gate directly over the first portion;
wherein (a) the first portion includes a flowable dielectric and is between the second and third portions; (b) the second portion includes a semiconductor material but no dielectric and the third portion includes no dielectric and at least one of the semiconductor material and another semiconductor material; (c) the second and third portions each couple to an interconnect; (d) the first portion includes a first sidewall including a first plane that is not parallel to the substrate; (e) the second portion includes a second sidewall including a second plane that is coplanar with the first plane; (f) a subportion of the second portion is completely surrounded, within a vertical plane, by the flowable dielectric and (g) the subportion of the second portion is not located directly between the gate and the substrate and does not intersect the vertical axis.

10. The apparatus of claim 9, wherein the flowable dielectric is selected from the group comprising silicon oxide, silicon dioxide, silicon nitride, oxynitride ($SiO_yN_x$), and silicon carbide.

11. The apparatus of claim 9 wherein the first, second, and third portions are included in a capacitor.

12. The apparatus of claim 11 wherein the capacitor is a metal-insulator-metal (MIM) capacitor.

13. The apparatus of claim 11 wherein the second and third portions are included in capacitive plates of the capacitor.

14. The apparatus of claim 9 wherein the first portion is included in a capacitor.

15. An apparatus comprising:
a fin including first and second portions that each intersect a vertical axis of the fin;
a third portion that intersects the vertical axis and is included in an upper portion of a substrate; and
a gate directly over the first portion;
wherein (a) the first portion includes a flowable dielectric and is between the second and third portions; (b) the second portion includes a semiconductor material but no dielectric and the third portion includes no dielectric and at least one of the semiconductor material and another semiconductor material; (c) the second and third portions each couple to an interconnect; (d) the first portion includes a first sidewall including a first plane that is not parallel to the substrate; (e) the second portion includes a second sidewall including a second plane that is not parallel to the substrate; (f) a subportion of the second portion is completely surrounded, within a vertical plane, by the flowable dielectric and (g) the subportion of the second portion is not located directly between the gate and the substrate.

16. The apparatus of claim 15, wherein the flowable dielectric is selected from the group comprising silicon oxide, silicon dioxide, silicon nitride, oxynitride ($SiO_yN_x$), and silicon carbide.

17. The apparatus of claim 15 wherein the first, second, and third portions are included in a capacitor.

18. The apparatus of claim 17 wherein the capacitor is a metal-insulator-metal (MIM) capacitor.

19. The apparatus of claim 17 wherein the second and third portions are included in capacitive plates of the capacitor.

20. The apparatus of claim 15 wherein the first portion is included in a capacitor.

* * * * *